US012569882B2

(12) United States Patent
Lal et al.

(10) Patent No.: US 12,569,882 B2
(45) Date of Patent: Mar. 10, 2026

(54) ULTRASONIC TRANSCEIVER ARRANGEMENT HAVING INCREASED ULTRASONIC SIGNAL RECEPTION

(71) Applicant: Geegah LLC, Ithaca, NY (US)

(72) Inventors: Amit Lal, Ithaca, NY (US); Justin Kuo, Ithaca, NY (US)

(73) Assignee: Geegah LLC, Ithaca, NY (US)

( * ) Notice: Subject to any disclaimer, the term of this patent is extended or adjusted under 35 U.S.C. 154(b) by 1136 days.

(21) Appl. No.: 17/615,310

(22) PCT Filed: Jun. 1, 2020

(86) PCT No.: PCT/US2020/035537
§ 371 (c)(1),
(2) Date: Nov. 30, 2021

(87) PCT Pub. No.: WO2020/243700
PCT Pub. Date: Dec. 3, 2020

(65) Prior Publication Data
US 2022/0219197 A1      Jul. 14, 2022

Related U.S. Application Data

(60) Provisional application No. 62/854,933, filed on May 30, 2019.

(51) Int. Cl.
B06B 1/02          (2006.01)
B06B 1/06          (2006.01)
(Continued)

(52) U.S. Cl.
CPC .......... B06B 1/0207 (2013.01); B06B 1/0625 (2013.01); H10N 39/00 (2023.02); B06B 2201/55 (2013.01)

(58) Field of Classification Search
CPC . B06B 1/0207; B06B 1/0625; B06B 2201/55; H10N 39/00
(Continued)

(56) References Cited

U.S. PATENT DOCUMENTS

2002/0007118 A1      1/2002      Adachi et al.
2017/0110504 A1      4/2017      Panchawagh et al.
2017/0169899 A1*     6/2017      Lal ........................ G11C 19/00

FOREIGN PATENT DOCUMENTS

WO          2014014968 A1      1/2014

OTHER PUBLICATIONS

Translated KR Office Action; Application No. 10-2021-7043113; Dated Dec. 29, 2021, Entire document.

* cited by examiner

*Primary Examiner* — Emily P Pham
*Assistant Examiner* — Monica Mata
(74) *Attorney, Agent, or Firm* — Bond, Schoeneck & King, PLLC; George R. McGuire

(57)          ABSTRACT

A transceiver apparatus for maximizing voltage. A voltage booster or transformer is implemented using piezoelectric thin films in substrates, preferably CMOS substrates where active processing of RF signals can lead to highly integrated and inexpensive ICs. The voltage gain is achieved by cascading multiple transducers, formed in the same piezoelectric thin film, or films cascaded in series on top of each other. An array of transducers are connected in parallel or series, connected to the input or output port electrodes. Other approaches include placing the receive transformer in a location where the diffracting field from the transmitter transducer is incident on the receive transducer generating a higher ultrasonic field at the receive transformer and increasing the voltage is to connect an array of transducers, formed (Continued)

in the same layer, or different layers of piezoelectric layer in parallel in drive mode when the pulse is transmitted.

19 Claims, 20 Drawing Sheets

(51) Int. Cl.
     *H01L 27/20*       (2006.01)
     *H10N 39/00*      (2023.01)
(58) Field of Classification Search
     USPC .......................................................... 310/311
     See application file for complete search history.

Input/output
port for
transducer

Red switches closed, yellow switches open -- T1-T3 are in parallel

Yellow switches closed, red switches open — T1-T3 are in series $$V_{out} \sim n V_{drive} * \dfrac{C_0/n^2}{\dfrac{C_0}{n^2} + C_{elec}}$$

$$V_{out}$$
$$= \frac{i_{motional}}{n} * nR_{rad}$$
$$= n * i_{motional} * R_{rad}$$
$$= n * V_{drive}$$

ULTRASONIC TRANSCEIVER ARRANGEMENT HAVING INCREASED ULTRASONIC SIGNAL RECEPTION

CROSS REFERENCE TO RELATED APPLICATIONS

This is a National Stage Application filed under 35 U.S.C. 371 based on International Patent Application No. PCT/CN2020/35537, filed on Jun. 1, 2020, which claims priority to U.S. Provisional Patent Application 62/854,933 filed on May 30, 2019, disclosures of both are incorporated herein by reference in their entireties.

GOVERNMENT FUNDING

This invention was made with government support under Award No. 1746710 awarded by the National Science Foundation (NSF). The government has certain rights in the invention.

BACKGROUND OF THE INVENTION

1. Field of the Invention

The present invention generally relates to a piezoelectric transceiver apparatus, voltage maximization methods, and applications thereof and, more particularly, to a CMOS circuit integrated with transducers for increasing a received voltage.

2. Description of Related Art

In the field of electrical engineering, a non-active amplification of voltage is called a passive transformer. An example of a passive transformer is a magnetic transformer in which the input coil number of turns are fewer than the output coil turns, resulting in a voltage gain proportional to the ratio of the number of turns.

A field related to magnetic transformers is that of ultrasonic piezoelectric transformers. In these ultrasonic piezoelectric transformers, a segment of a piezoelectric device is driven across a smaller dimension at a low voltage. The resonator drives motion across the structure such that a second part of the resonator consists of electrodes at a greater distance between the electrodes. Since the electric field integrated over the longer length leads to a higher voltage, voltage amplification is achieved, at the cost of lower output capacitance. In some of these transformers, the energy injected into a set of electrodes is concentrated into a central electrode area to magnify the ultrasonic energy and hence, voltage, when the ultrasonic strain is converted back into a voltage.

There are other resonant transformers that are driven at a set of electrodes presenting themselves at a low impedance of input, and the output is taken out at higher impedance. In many of the transformers, a key disadvantage is the need for a mechanical boundary to increase the quality factor of the resonator to high voltages. The higher the quality factor, the more the ultrasonic amplitude is built up to increase the voltage at the output port. However, any transformer is only useful if one adds a load into which the transformer modified voltage source delivers power into. Any load consumes energy and reduces the quality factor, reducing the voltage boost of the transformer. In order to maintain a high Q even with a load, the mechanical energy stored in the resonator must be increased mostly by increasing the volume of the transformer. Furthermore, the requirement for forming boundary conditions typically requires etching and releasing resonant systems. This processing can be expensive in production and can also reduce yield of produced devices, owing to effects such as stuck released parts and extensive variations in resonance frequencies due to variations in built in thermal and interfacial thin film stress across the devices, and devices across wafers. Thus, a solidly mounted voltage transformer on a substrate is desired to reduce the requirement of any additional processing. An example of such a voltage transformer is with two thin film piezoelectric transducers placed on opposite sides of a substrate. The input transducer sets up a standing wave in the bulk of the substrate. If the phasing of the ultrasonic field is correct, a voltage is generated at the output transducer. This structure isolates the input to output ports, forming a transformer. The loading at the output port can affect the acoustic impedance at the input port and can also modify the frequency over which the voltage received will be maximized.

In recent work (U.S. Pat. Nos. 10,217,045 B2 and 9,761,324 B2), approaches to transmitting ultrasonic pulses at carrier frequencies in the gigahertz range have been described. RF pulses carrying tens of RF carrier frequency are generated using thin piezoelectric thin films, and travel through the bulk structure. The transducers can be on both sides of the substrate so one side can transmit the pulses and one side can receive the pulses. The receiving side can also receive pulses that are reflected from the opposing side of the pulse. In these applications, it is important to detect the pulses with the highest possible signal to noise ratio and at as low power as possible to enable battery powered applications, and generate as little heat as possible.

Therefore, there is a need for systems and methods to boost the signal levels to increase the signal to noise ratio of the electrical subsystem using piezoelectric transducers and transistor electronics.

BRIEF SUMMARY OF THE INVENTION

In the invention described herein, a voltage booster or transformer is implemented using piezoelectric thin films in substrates, preferably CMOS substrates where active processing of RF signals can lead to highly integrated and inexpensive ICs. The voltage gain is achieved by cascading multiple transducers, formed in the same piezoelectric thin film, or films cascaded in series on top of each other. An array of transducers is connected in parallel or series, connected to the input or output port electrodes. A second approach described is where the receive transformer is placed in a location where the diffracting field from the transmitter transducer is incident on the receive transducer generating a higher ultrasonic field at the receive transformer. A third approach is to increase the voltage is to connect an array of transducers, formed in the same layer, or different layers of piezoelectric layer in parallel in drive mode when the pulse is transmitted. Then, the transducers are configured dynamically to link in series to get a higher voltage when the ultrasonic pulse is received back at the transducer, after it reflects from the backside of the substrate. Higher transducer impedance occurs due to a series of piezoelectric transducers placed in series such that the overall reactive impedance is higher owing to a lower capacitance.

Embodiments of the present invention are directed to a transceiver apparatus for maximizing voltage. According to one aspect, the transceiver includes a substrate having a first surface and an opposing second surface. The transceiver also includes a CMOS device with one or more CMOS circuits attached to the first surface of the substrate and one or more piezoelectric transducers attached to an outer surface of the CMOS device. Each of the one or more piezoelectric transducers is configured to emit an ultrasonic wave toward the second surface of the substrate.

According to another aspect, the ultrasonic wave is phased to produce high amplitude ultrasonic waves by focusing According to another aspect, the substrate is composed of a flexible, stretchable material.

According to another aspect, the substrate is composed of at least one of a silicon wafer, SiC wafer, and, a silica wafer.

According to another aspect, the one or more piezoelectric transducers are composed of piezoelectric materials AlN or $Al_xSc_yN$.

According to another aspect, at least one of the one or more piezoelectric transducers is configured to emit a standing ultrasonic wave toward the second surface of the substrate.

According to an alternative aspect, the transceiver includes a substrate having a first surface and an opposing second surface. The transceiver also includes a first layer of one or more piezoelectric transducers attached to the first surface of the substrate, a buffer layer attached to the first layer of one or more piezoelectric transducers, and a second layer of one or more piezoelectric transducers attached to the buffer layer. The buffer layer is between the first and second layers of one or more piezoelectric transducers. The first layer of one or more piezoelectric transducers and the second layer of one or more piezoelectric transducers are connected in a cascaded configuration via electrical connectors.

According to an additional aspect, the transceiver also includes a top insulative layer attached to an outer surface of the second layer of one or more piezoelectric layers.

According to an additional aspect, the transceiver also includes a CMOS device comprising one or more CMOS circuits. The CMOS device is connected between the first layer of one or more piezoelectric transducers and the substrate.

According to an additional aspect, the CMOS device comprises a BEOL layer and a FEOL layer, wherein the BEOL layer is a metallization layer and the FEOL layer is a transistor layer connected between the BEOL layer and the substrate.

According to an additional aspect, the transceiver also includes an insulative layer connected between the first layer of one or more piezoelectric transducers and the CMOS device.

According to an additional aspect, the transceiver also includes metal vias connecting the electrical connectors to the CMOS device.

According to an additional aspect, the transceiver also includes electrical pads connected to the electrical connectors and extending at least to an outer surface of the first or second layer of one or more piezoelectric transducers.

According to an additional aspect, the substrate has a backside with a pattern.

According to an additional aspect, the second layer of one or more piezoelectric transducers comprises at least one space between two of the one or more piezoelectric transducers.

According to an additional aspect, at least one of the first layer of one or more piezoelectric transducers and the second layer of one or more piezoelectric transducers is one large transducer.

According to an additional aspect, in at least one of the first layer of one or more piezoelectric transducers and the second layer of one or more piezoelectric transducers, the piezoelectric transducers are connected in series.

According to an additional aspect, in at least one of the first layer of one or more piezoelectric transducers and the second layer of one or more piezoelectric transducers, the piezoelectric transducers are connected in parallel.

According to an additional aspect, at least one of the one or more piezoelectric transducers of the first layer or the second layer emits an ultrasonic wave toward the substrate and the at least one of the one or more piezoelectric transducers is positioned based on focal points of the waves determined by the wave concentration due to ultrasonic anisotropic wave propagation in anisotropic substrates.

According to yet another aspect, the transceiver includes a substrate having a first surface and an opposing second surface. The transceiver also includes a first layer of one or more piezoelectric transducers attached to the first surface of the substrate, a buffer layer attached to the first layer of one or more piezoelectric transducers, and a second layer of one or more piezoelectric transducers attached to the buffer layer. The buffer layer is between the first and second layers of one or more piezoelectric transducers. The first layer of one or more piezoelectric transducers and the second layer of one or more piezoelectric transducers are connected in a circuit with one or more transistor switches. The transistor switches can be turned on or off to achieve reconfigurability between a first configuration and a second configuration.

According to another aspect, in the first configuration, the one or more piezoelectric transducers of at least one of the first and second layers transmit in parallel and in the second configuration, the one or more piezoelectric transducers of at least one of the first and second layers transmit in series.

These and other aspects of the invention will be apparent from and elucidated with reference to the embodiment(s) described hereinafter.

BRIEF DESCRIPTION OF THE SEVERAL VIEWS OF THE DRAWING(S)

The present invention will be more fully understood and appreciated by reading the following Detailed Description in conjunction with the accompanying drawings. The accompanying drawings illustrate only typical embodiments of the disclosed subject matter and are therefore not to be considered limiting of its scope, for the disclosed subject matter may admit to other equally effective embodiments. Reference is now made briefly to the accompanying drawings, in which.

DETAILED DESCRIPTION OF THE INVENTION

Aspects of the present invention and certain features, advantages, and details thereof, are explained more fully below with reference to the non-limiting examples illustrated in the accompanying drawings. Descriptions of well-known structures are omitted so as not to unnecessarily obscure the invention in detail. It should be understood, however, that the detailed description and the specific non-limiting examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

The apparatus and methods described herein detail ways to increase the voltage level of an ultrasonic signal received at a piezoelectric transducer. The methods described are pertinent to integration of the transducers with transistors in CMOS integrated circuits, to process the signal and energy contained in the ultrasonic pulses. The purpose of the invention is to transform the input voltage to a higher voltage. Although in most applications voltage increase is desired, in some applications voltage decrease is desired, and which can be achieved with the devices described by reversing the transmit and receive ports. One example of such an application is voltage conversion from wall AC voltage at 120 VAC to 5 Volts DC.

Figure 1A:
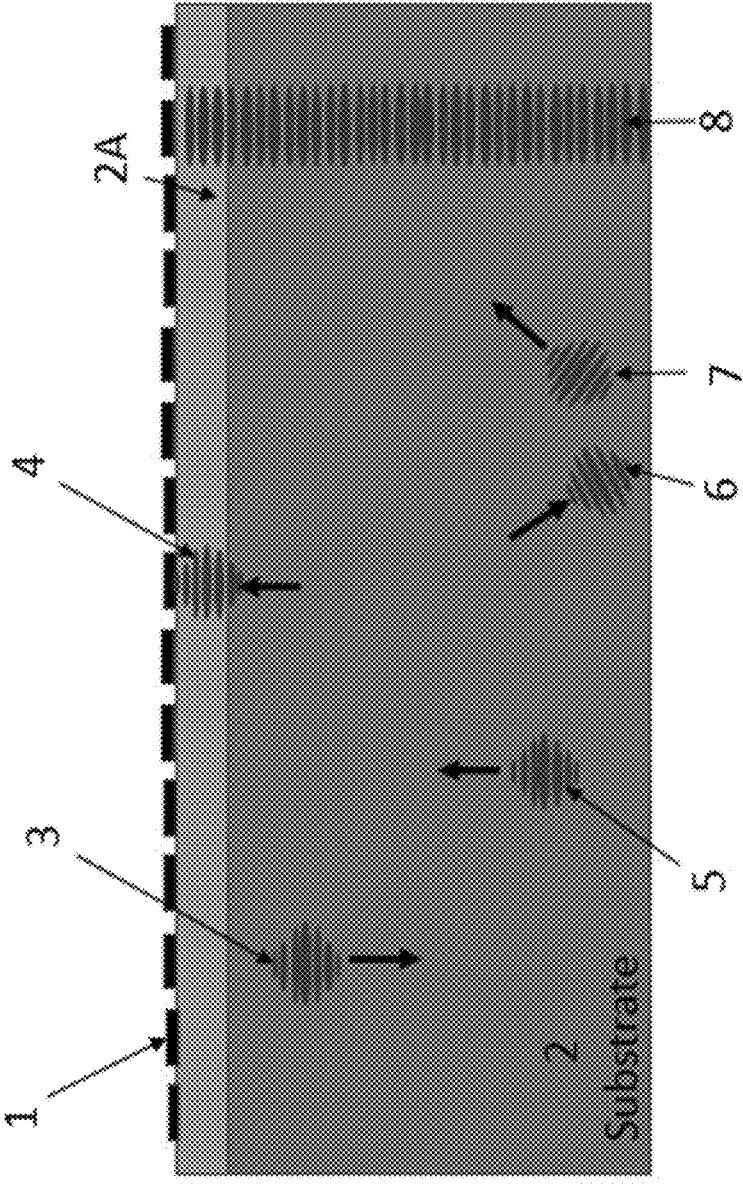
FIG. 1A is a cross-section view schematic representation of solidly mounted piezoelectric transducers, according to an embodiment.

Referring now to FIG. 1A, there is shown a cross-section view schematic representation of solidly mounted piezoelectric transducers 1, according to an embodiment. In FIG. 1A, the piezoelectric transducers 1 are mounted to a substrate 2. The substrate 2 shown is a CMOS substrate (CMOS layer 2A), but it can be a non-CMOS substrate. For example, the substrate 2 can be a silicon wafer, SiC wafer, or a fused silica wafer. In an embodiment, the substrate 2 thickness is within the range of 100 to 750 µm range such that a pulse can be transmitted and received at different times by transducers 1 placed on the top surface of the substrate 2. Transducers 1 can be placed on the top and/or bottom of the substrate 2. In the embodiment shown in FIG. 1A, piezoelectric transducers 1 are placed on top the substrate 2.

The piezoelectric transducers 1 launch ultrasonic pulses 3 when driven with pulses of voltages. A pulse 4 can travel to the bottom of the substrate 2 and reflect off. For example, pulse 4 is received at the top transducer 1 for conversion back to electric signal. Pulse 5 represents a pulse that is midway after reflection. Pulse 6 is travelling at an angle to the normal that can be arranged by firing an array of transducers 1 at different phases and time delays as done in RADAR and SONAR systems. Pulse 7 is reflected at an angle. FIG. 1A also shows a standing wave 8 in the bulk substrate 2 when the drive signal is applied continuously or for a long period of time compared to the transit time of the pulses 3. In an embodiment, at 1-GHz frequencies, the wavelength of the ultrasonic waves is ~9 microns, producing a wave train of 10-20 cycles of 1-GHz occupies 90 to 180 µm in space in depth.

Figure 1B:
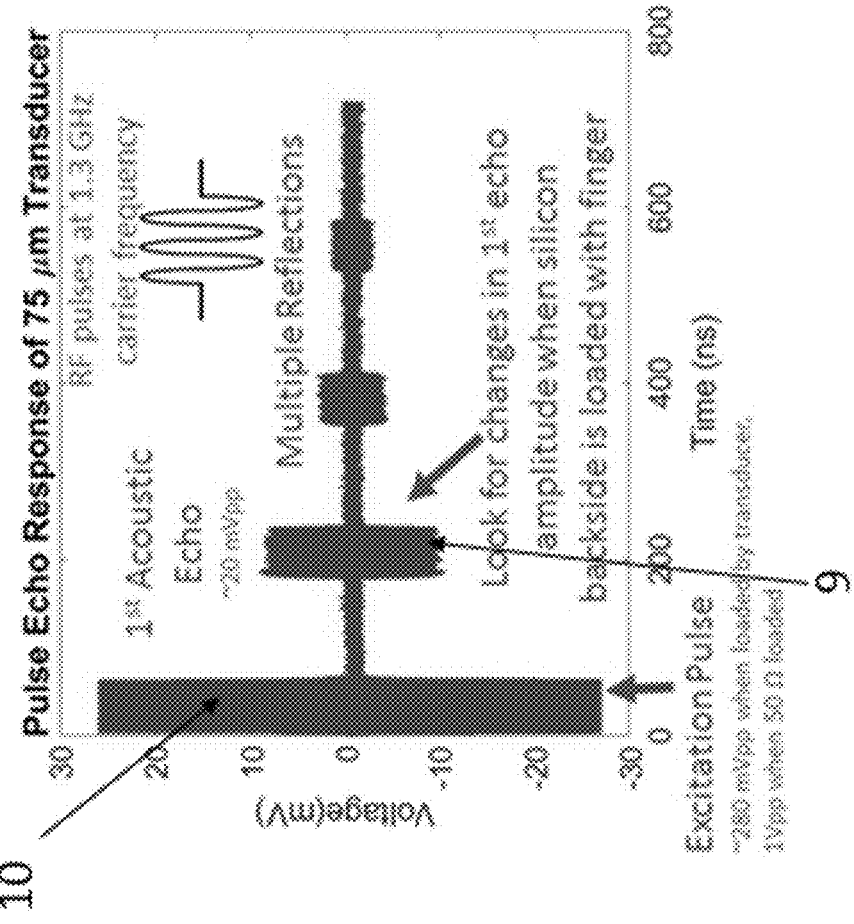
FIG. 1B is a graph of a typical pulse amplitude curve received on a transducer after firing a short pulse.

FIG. 1B shows a typical pulse amplitude curve received on a transducer 1 after firing a short pulse 10. The pulse 10 is the received signal due to RF coupling from the drive transducer into the receive transducer (note, transducers 1 are shown generally in FIG. 1A). FIG. 1B also shows the first reflected signal 9 received. The time difference corresponds to C/2L where C is the speed of sound and L is the thickness of the substrate 2. As is depicted in FIG. 1B, the amplitude of the received first reflection and consequent reflections can be small—in the 10s of millivolt range. In order to process this signal for signal amplitude extraction or demodulation using a mixer, it is desirable to amplify this signal to as high a voltage as possible. This requires high gain amplifiers that consume power and reduce SNR. A passive approach to increase the amplitude is therefore desired.

Figure 2A:
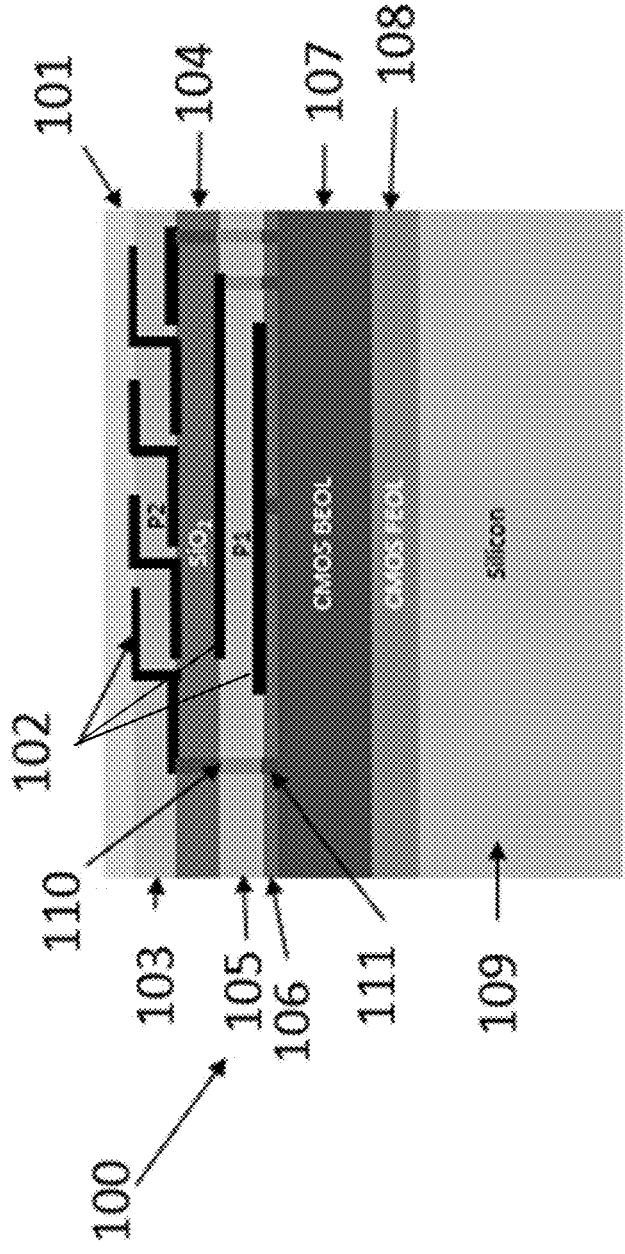
FIG. 2A is a cross-section view schematic representation of a piezoelectric stack, according to an embodiment.

Turning now to FIG. 2A, there is shown a cross-section view schematic representation of a piezoelectric stack 100, according to an embodiment. The piezoelectric stack 100 can have a transducer that sends the energy towards the bottom of the transducer where it can reflect off, by getting effected by the reflectance coefficient of the interface between the substrate and the bottom body. In order to maximize the energy reflected, the interface can consist of material with very different acoustic impedance than the substrate. The material can be soft materials such as polymers, which have much lower impedance than silicon substrate. Polymer examples include silicone, PDMS, SU8, epoxies, glues. An alternative material is soft polymer with nanoparticles of metals that has a higher ultrasonic impedance to absorb the ultrasonic energy reducing the reflection of the waves. The material can also be air gap, by supporting the chip at the edges to the package layer. The air gap would give a very high reflection coefficient. The backside can be patterned with different boundary conditions of absorption and reflection to control the ultrasonic wave distribution in the substrate. Upon the pulse coming back, the energy is received by many smaller transducers in series.

The piezoelectric stack 100 comprises a top insulative layer 101 that can be used to adjust the acoustic response of the piezoelectric stack 100 due to its thickness and acoustic impedance. The piezoelectric stack 100 also includes electrodes 102 extending across piezoelectric layers P1 103 and P2 105 to excite and sense charge due to mechanical waves excited in the substrate 109. The thickness and material of the electrodes 102 (i.e., electrode layer) can affect the acoustic impedance and hence can be optimized to achieve optimum transmit-receive characteristics. The piezoelectric layers 103, 105 can be made of AlN (Aluminum Nitride) or other thin file piezoelectric materials, such as AlScN (or $Al_xSc_yN$) and ZnO. The two piezoelectric layers 103, 105 can be isolated (i.e., separated) by an ultrasonic buffer layer 104 (i.e., insulating dielectric layer) with the thickness and ultrasonic impedance to maximize the transmitter and receiver energy coupling to the resonator.

Still referring to FIG. 2A, the P1 layer 103 is shown to be one large transducer with the top and bottom electrodes 102 being continuous. The P2 layer 105 is broken up into smaller transducers but connected in series. Thus, the P1 layer 103 is one large transducer and the P2 layer 105 is multiple transducers cascaded in series. An outgoing wave packet is sent through the silicon substrate 109 and is received back in the multitude of transducers in series (in the P2 layer 105), while a resonant mode can be setup in the thickness of the silicon crystal substrate 109. The thickness of the isolating $SiO_2$ layer 104 can be optimized to maximize the signal on the receive transducer by placing it at half-wavelength spacings. Other insulating layers, or combinations of insulating layers could be used instead of just one layer. The buffer layer 104 itself can be made of sub-layers to achieve optimum coupling and is an electrical insulator.

In another embodiment, an additional insulator layer (not shown) can be used on top of the piezoelectric layers 103, 105 to serve as both a passivation layer and to acoustically load the stack of top and bottom piezoelectric transducers to control the frequency response of the first and second piezoelectric layers 103, 105. Depending on the choice of materials for the metal electrodes 102 and the piezoelectric layers 103, 105, a seed layer may be required beneath the bottom-most electrode 102 on the substrate 109 to orient the crystallinity of the piezoelectric material. A typical choice of materials will consist of molybdenum for the electrode layers 102, AlN or $Al_xSc_yN$ for the piezoelectric layers 103, 105, $SiO_2$ for the insulator layer 104 and for the top passivation layer, and an AlN seed layer for the bottom-most electrode 102.

In FIG. 2A, the transducer is shown fabricated on a CMOS substrate 107, 108, where FEOL refers to the transistor front-end-of-line CMOS layers 108 and BEOL refers to the back-end-of-line CMOS metallization layers 107. An insulator layer (such as silicon dioxide) 106 may be required to insulate the bottom electrode 102 from the CMOS top metal 107. The insulative layer 106 has metal vias 111 that connect the top-level connections in CMOS (e.g., CMOS BEOL layer 107) to the transducers through more layers of vias 110. These vias 111 connect the various metal layers electrically so that the receive transducer electrodes 102 can be cascaded in series. The vias 111 are also used to connect the transducer electrodes 102 to the CMOS metallization 107, 108 to connect to the CMOS circuits. The CMOS transistor layer 108 (CMOS FEOL layer 108) can sense and drive the piezoelectric transducers on the devices. The circuit can be connected to one of the piezoelectric transducers and can be used to drive an ultrasonic wave and pulse in the bulk of the silicon 109. The receive transducer can be connected to transistors for energy processing.

Figure 2B:
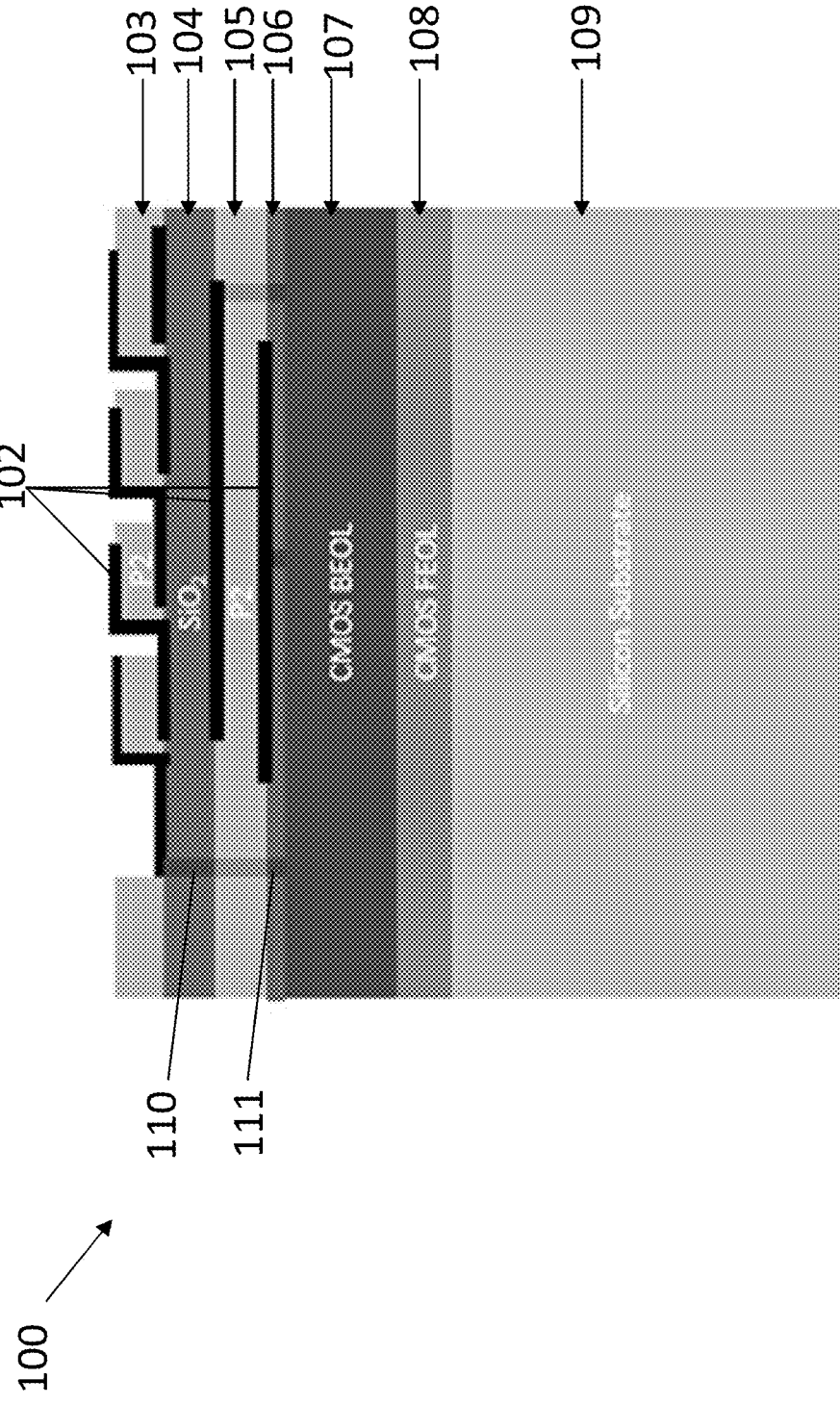
FIG. 2B is a cross-section view schematic representation of a piezoelectric stack, according to an alternative embodiment.

Turning now to FIG. 2B, there is shown a cross-section view schematic representation of a piezoelectric stack 100, according to an alternative embodiment. This stack 100 is similar to the stack 100 shown in FIG. 2A, with the elimination of the top buffer layer 101. Further, the P2 piezoelectric layer 103 of the stack 100 in FIG. 2B is etched out to better insulate the different transducers by air.

Figure 2C:
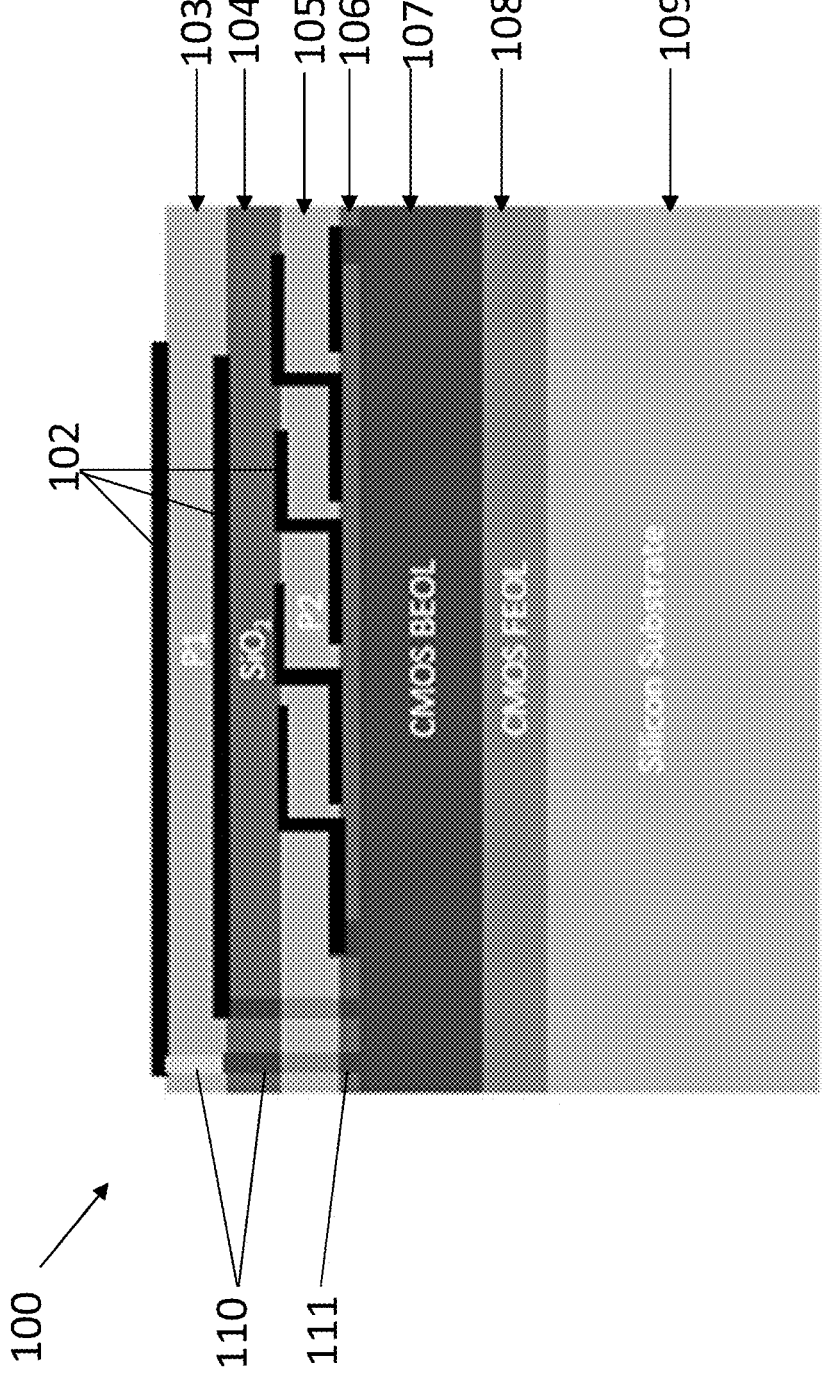
FIG. 2C is a cross-section view schematic representation of a piezoelectric stack, according to another alternative embodiment.

Referring to FIG. 2C, there is shown a cross-section view schematic representation of a piezoelectric stack 100, according to another alternative embodiment. The stack 100 in FIG. 2B is similar to that shown in FIG. 2A, with the continuous transducer layer P1 105 and the segmented transducer layers P2 103 switched. This configuration may yield better electrical performance owing to different number of vias 110 connected to the receiver vs. the transmitter, as each via adds to the parasitic capacitance to the transducers.

Figure 2D:
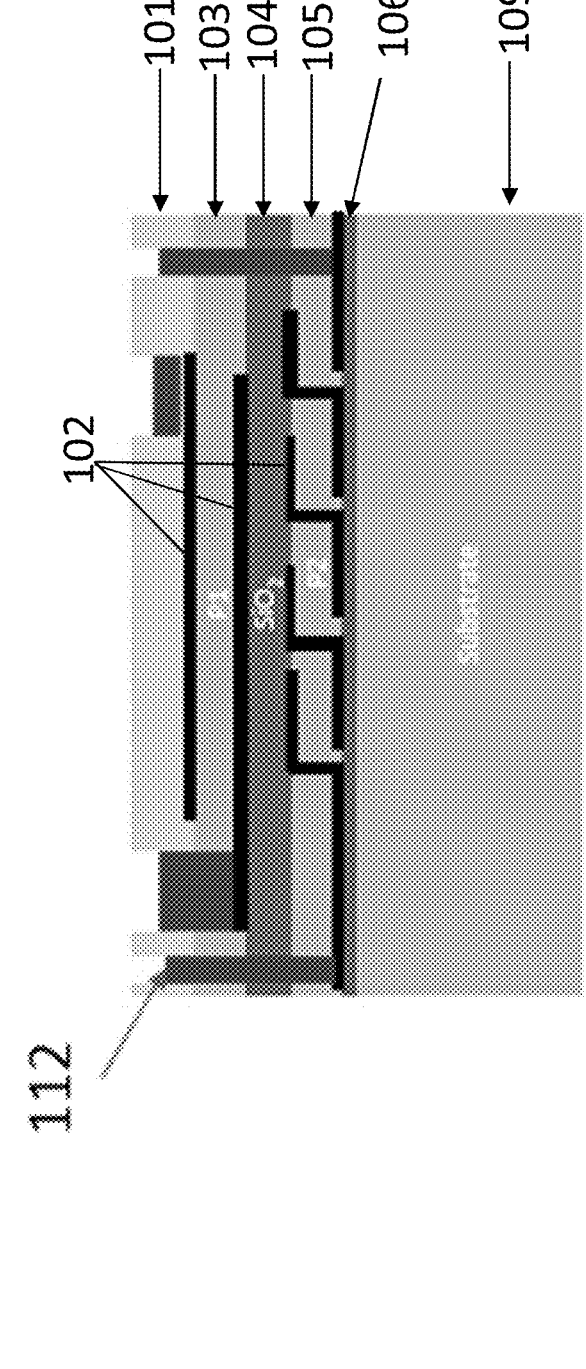
FIG. 2D is a cross-section view schematic representation of a piezoelectric stack, according to yet another embodiment.

Turning to FIG. 2D, there is shown a cross-section view schematic representation of a piezoelectric stack 100, according to yet another embodiment. The stack 100 in FIG. 2D is similar to that in FIG. 2A, except here there is no CMOS substrate 107, 108 and active electronics. Here, the transducers are connected to connecting electrical pads 112 exposed on the top. Such a transducer can be connected to CMOS of off-the-shelf electronics through commonly used methods such as wire-bonding, ball-grids arrays, and flip-chip bonding. The substrate 109 can be any substrate made of silicon, germanium, fused quartz, or other materials.

The structures described in FIG. 2 pertain to one transformer unit. These units themselves can be placed in series and parallel to achieve desired input and output impedance while providing voltage transformation.

In the configuration of multiple transducers in the same plane, each of the transducers receives or is exposed to almost the same ultrasonic velocity and strain field, each generating a voltage across it. The uniformity of the strain will be a function of how well the acoustic field reflections are designed such that the strain fields at the transducer is in phase. Due to the ultrasonic strain in the transducers, each of the pulse transducers generates a charge proportional to its area, and the voltage of each transducer is added in series to achieve a higher voltage, due to the piezoelectric effect. When this voltage is placed at the input node of a transistor gate, which is part of an amplifier, the voltage conducts current through the transistor in typical Common Source or Common Drain amplifier configurations. The transistor current can go through a load impedance to generate an output voltage. Typically, the amplifiers require a DC bias current to functionalize the transistors in an amplifying state. Generally, amplifiers can consist of several stages of biased transistors. By increasing the input voltage to the amplifier to be higher, without consuming power using the transformer structure, the gain needed from the electronic amplifiers can be lower. This lowers the bias current of the amplifier subcomponents, decreasing the power consumption of the amplifier and the overall sensor and imager device.

Since the noise voltage of the transistor amplifier is typically proportional to the power and the size of the transistor, a larger voltage signal provides a higher signal and therefore a higher signal to noise ratio (SNR). By reducing the needed electronic gain, a higher SNR can be obtained, as the input signal can be larger than the equivalent electrical noise of the transistor circuits. In some applications, such as energy harvesting, the energy coming from the RF signal is to be converted to a DC voltage and stored for usage in powering a circuit. If the higher voltage signal generated by the series connection is placed into a diode rectifying circuit, to rectify the incoming signal, as an energy detector or energy recovery element, the effectiveness of the energy transfer is higher owing to higher input voltages. The diodes require a voltage above a certain turn-on voltage to be able to drive current into a load, and the current is a function of the voltage above the threshold voltage. The higher the voltage, the more the current flows through the rectifiers, decreasing the effective resistance of the diodes, which thereby decreases the power dissipated in transferring the power across the diode.

Figure 11:
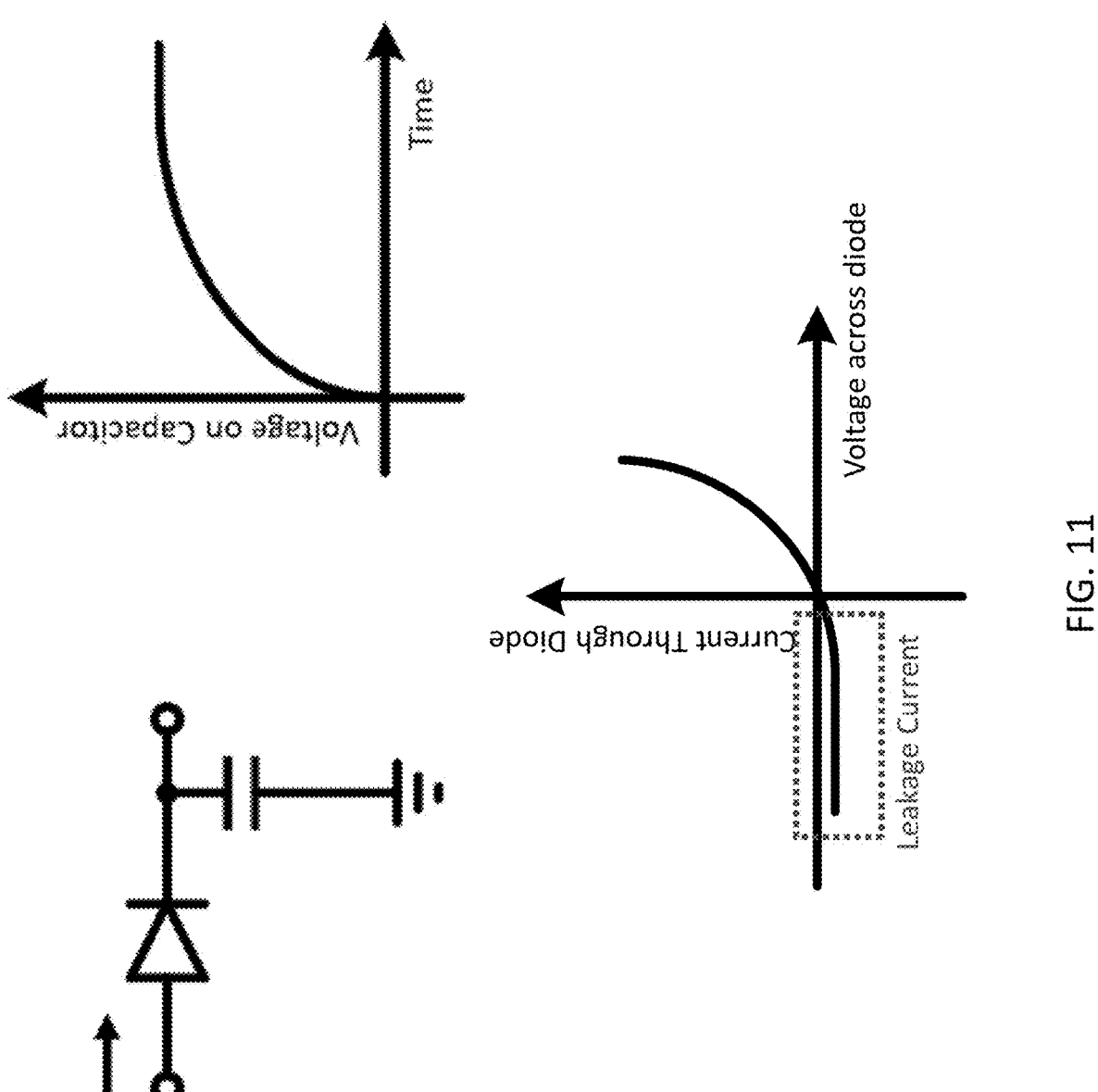
FIG. 11 is representative current versus voltage curve of a rectifying diode showing leakage and current.

FIG. 11 shows the current vs voltage curves for diodes that are used to convert the oscillatory voltages into a DC voltage stored on a capacitor. As seen the current increases exponentially with input voltage decreasing the effecting resistance of each diode. Furthermore, the leakage current is shown which limits the maximum voltage that can be reached by the amplifier.

The detailed analysis for the voltage amplifier or transformer utilizing two transducer layers separated by a buffer later are described below using the equations below.

$$D = \epsilon E + eS \qquad \text{(Eq. 1)}$$

$$I = j\omega A\epsilon E + j\omega AeS \qquad \text{(Eq. 2)}$$

Figure 12:
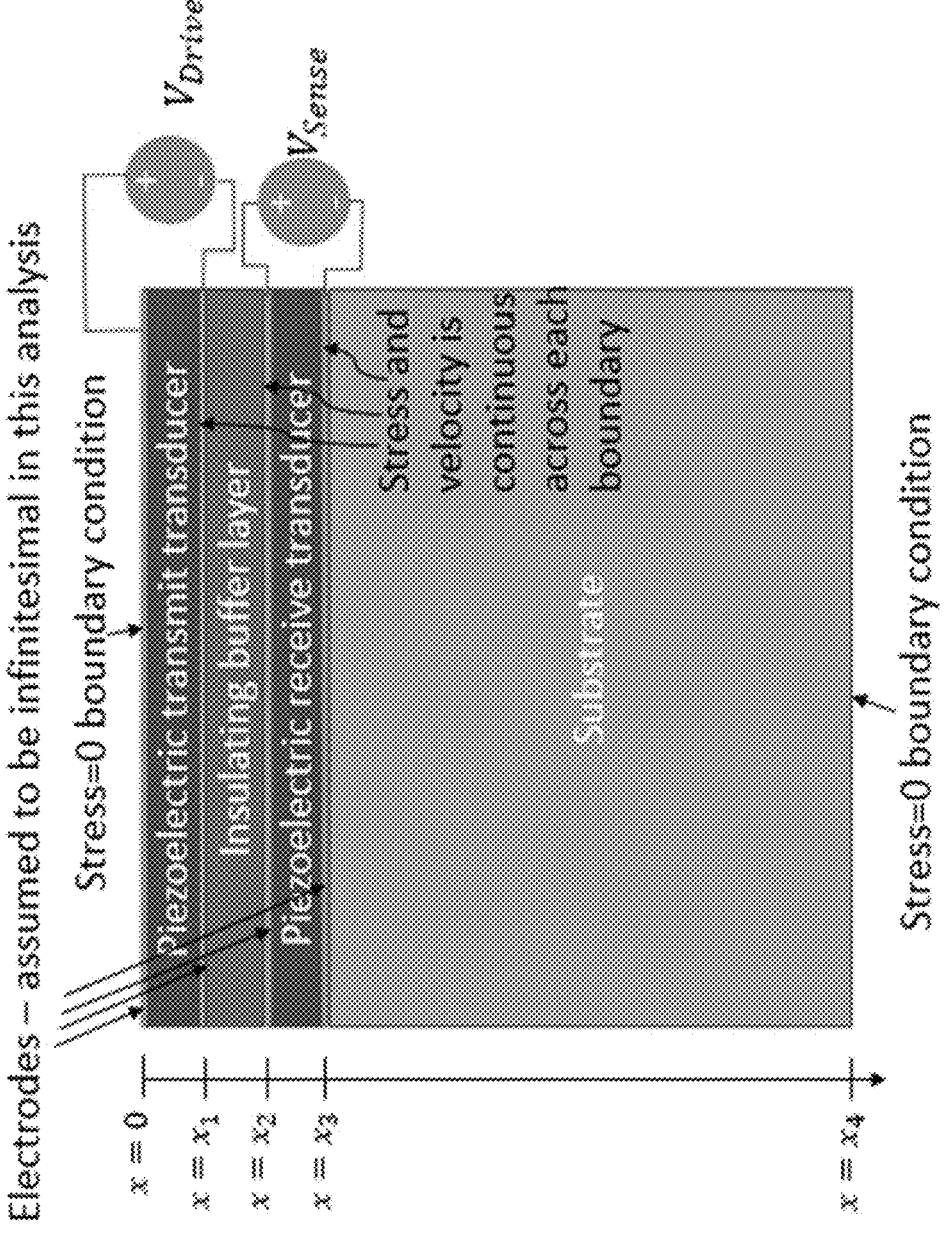
FIG. 12 is a schematic representation of a transducer stack used in the transformer model.

These equations are commonly called the constitutive equations connecting the electrical and mechanical variables across the piezoelectric layer. We can assume four layers for this one-dimensional model of the transducer stack. FIG. 12 shows a schematic representation of the transducer stack used in the aforementioned model. The first layer is the top piezoelectric layer used as the transmitter going from x=0 to $x=x_1$. This transducer can be the drive or the input transducer that drives the entire stack. The next layer can be the $SiO_2$ layer going from $x=x_1$ to $x=x_2$. The third layer is the receive layer going from $x=x_2$ to $x=x_3$. The fourth layer can be the bulk silicon $x=x_3$ to $x=x_4$. Here the values of the $x_i$ variables are chosen to correspond to the AlN thicknesses and the buffer layer thicknesses, and the silicon wafer thickness. Using Eq. 1 and Eq. 2, integrate across the piezoelectric layer:

$$\int I dx = I t_{aln} = \int j\omega A\epsilon E dx + \int j\omega AeS dx$$

10

-continued $$I = j\omega \frac{A\epsilon}{t_{aln}} \int E dx + j\omega \frac{Ae}{t_{aln}} \int S dx$$

$$E = -\frac{d\phi}{dx}$$

$$I = j\omega \frac{A\epsilon}{t_{aln}} \int -\frac{d\phi}{dx} dx + j\omega \frac{Ae}{t_{aln}} \int S dx$$

The equation for the electric field is the definition of the electric field as a function of the electric potential $\phi(x)$. The integral above for the receive transducer goes from $x=x_2$ to $x=x_3$, and if V defined to be positive at $x=x_2$, and ground at $x=x_3$ we can have V as the answer for the integral.

$$I = j\omega C_{ox} V + j\omega \frac{Ae}{t_{aln}} \int S dx = j\omega C_{ox} V + j\omega \frac{Ae}{t_{aln}} (u[x_3] - u[x_2])$$

Here u[x] is the ultrasonic displacement in the stack in the receive transducer. If the receive transducer is broken up into N transducers, we have each transducer producing 1/N o the current. We can write:

$$I = \frac{j\omega C_{AlN}}{N} V + j\omega \frac{Ae}{N t_{aln}} \int S dx$$

We assume that the receive transducer is connected to a load impedance $Z_L$. The load impedance can be the amplifier input impedance or load of the rectifier for RF energy harvesting. The current from this transducer will be driven into the load to produce a voltage:

$$V_{out} = -I * Z_L$$

We have the minus sign as the current I is defined as the current going into the transducer, and in our case the current is going into the transducer. With this assumption we can write:

$$-\frac{V_{out}}{Z_L} = \frac{j\omega C_{AlN}}{N} V + j\omega \frac{Ae}{N t_{aln}} \int S dx$$

Here $V_{out}$=N*V as each of the transducer produces V voltage. Hence, $$-\frac{NV}{Z_L} = \frac{j\omega C_{AlN}}{N} V + j\omega \frac{Ae}{N t_{aln}} \int S dx$$

$$V\left(\frac{N}{Z_L} + \frac{j\omega C_{AlN}}{N}\right) = -j\omega \frac{Ae}{N t_{aln}} \int S dx$$

Multiplying everything by N and $$\frac{1}{j\omega C_{ox}},$$

we get:

$$V\left(\frac{N^2}{j\omega C_{AlN}Z_L} + 1\right) = -j\omega \frac{NAe}{j\omega C_{AlN}Nt_{aln}} \int S dx$$

$$V = \frac{-1}{1 + \frac{N^2}{j\omega C_{AlN}Z_L}} \frac{e}{\epsilon} \int S dx$$

This voltage V is the voltage at the output of each of the segmented transducers. The strain in the receive transducer will be due the drive/transmit transducer. The strain in the receiver S(x) can be written in terms of the driver transducer strain driven by a voltage $V_{in}$.

$$S(x) = Q\frac{e}{Y}\frac{V_{in}}{t_{aln}} * d(x)$$

Here we assume the transmitter sets up a resonant system with a quality factor Q, and $$\frac{e}{Y}\frac{V_{in}}{t_{aln}}$$

is effectively $d_{33}E$ strain related to commonly used piezoelectric constitutive equations. factor d(x) will be a factor depending on how well the strain is distributed in the receive transducer across the receiver. We can write:

$$\int S dx = \int Q\frac{e}{Y}\frac{V_{in}}{t_{aln}} * d(x)dx$$

$$V = \frac{-1}{1 + \frac{N^2}{j\omega C_{AlN}Z_L}} \frac{e}{\epsilon} \int Q\frac{e}{Y}\frac{V_{in}}{t_{aln}} * d(x)dx$$

The integral is an integral over x so can be written as a factor $\Gamma$ times $t_{aln}$.

$$V = \frac{-1}{1 + \frac{N^2}{j\omega C_{AlN}Z_L}} \frac{e}{\epsilon} Q\frac{e}{Y}\frac{V_{in}}{t_{aln}} * \Gamma t_{aln}$$

This can be simplified to:

$$V = \frac{-1}{1 + \frac{N^2}{j\omega C_{AlN}Z_L}} \Gamma Q K^2 V_{in}$$

Here we use the fact that $$K^2 = \frac{e^2}{\epsilon Y},$$

which is often called the electromechanical coupling constant. The voltage V is the voltage of one transducer so the voltage over the transducers placed in series is:

$$V_{out} = NV = \frac{-N}{1 + \frac{N^2}{j\omega C_{AlN}Z_L}} \Gamma Q K^2 V_{in}$$

Figures 8C, 9A:
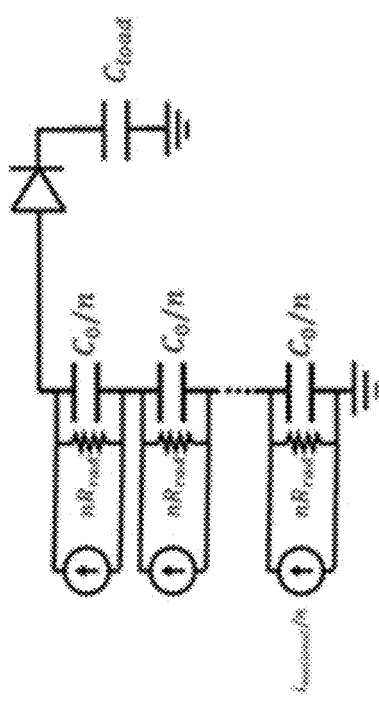
FIG. 8C is an equation to determine the received voltage on the amplifier input.
FIG. 9A is a schematic representation of acoustic transformer receive transducers connected in series to a diode rectifier load.

This expression shows that if N is increases, we increase the voltage, but then, the $N^2$ factor reduces the voltage. As $Z_L$ is increased the voltage increases, and if $C_{AlN}$ is increased the voltage also increases. If the quality factor increases, more of the ultrasonic amplitude build up in the resonator results in an increased output voltage. Referring now to FIG. 9A, there is shown the application in which the series connection of acoustic transformer receive transducers are connected in series to a diode rectifier load, for example, as in a RFID transponder. The series connections of the transducers result in a higher input voltage (as discussed above) feeding into the diode rectifier. This higher input voltage allows the diode rectifier to be operated in a higher efficiency regime, resulting in higher conversion efficiency for the input RF power.

In another approach to amplify voltages, which can be incorporated with any of the other methods described herein, the natural ability of crystalline anisotropic materials is used to focus ultrasonic waves and the corresponding mechanical energy at specific locations, where receive transducers are specially placed to extract the energy. Anisotropic crystals have the capability to divert energy flow towards a focal point, owing to the group velocity differences along different crystalline axes. Under some circumstances, the waves bend towards a central location determined by the geometry of the transducers and the reflecting boundary conditions of the substrate 109 (FIGS. 2A-2D). The transmit and the receive electrodes 102 (FIGS. 2A-2D) are placed such that the generated acoustic waves are focused owing to the anisotropy of the crystal.

Figure 3B:
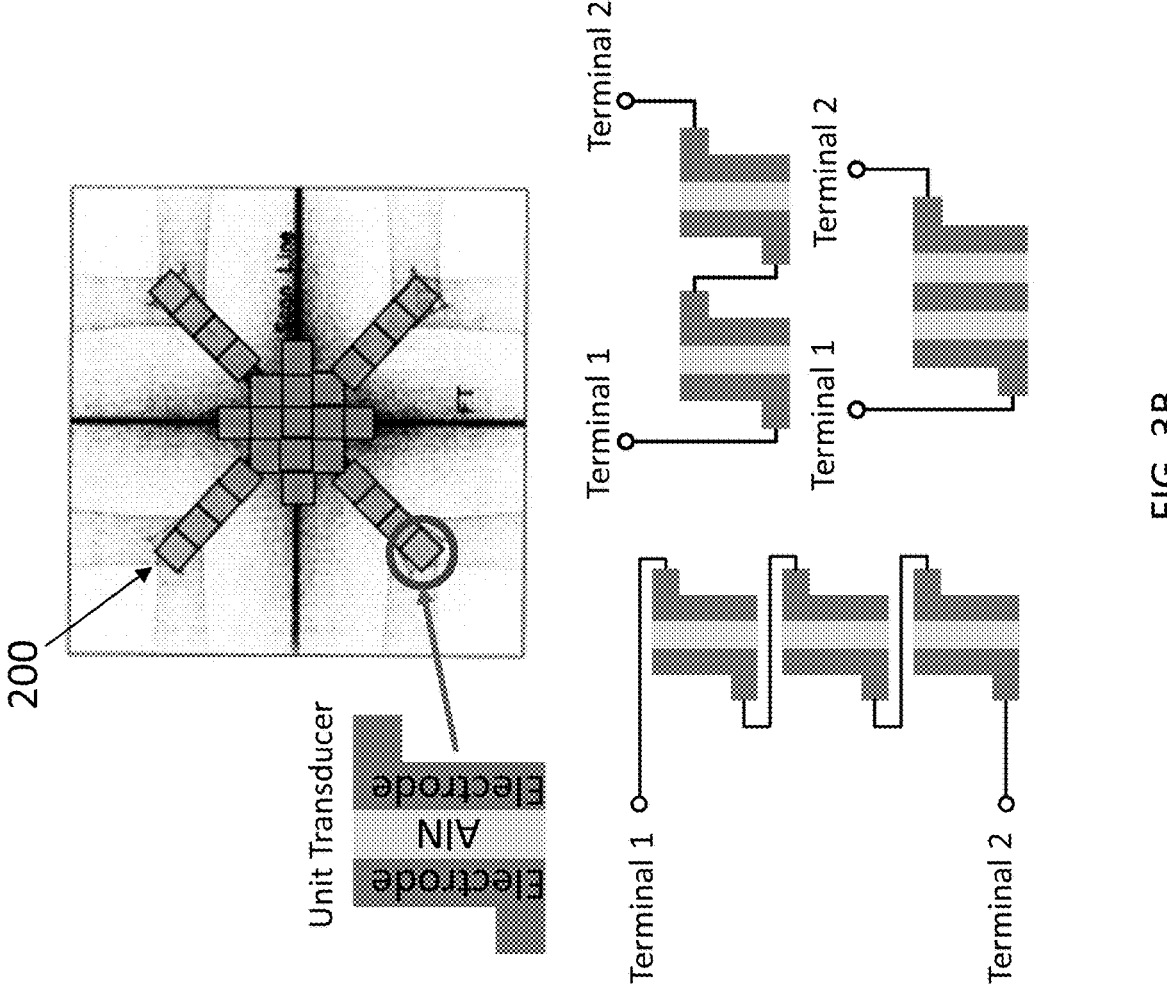
FIG. 3B is a graphical depiction of receive transformer array transducers on the anisotropic focusing pattern of FIG. 3A.
Figure 3A:
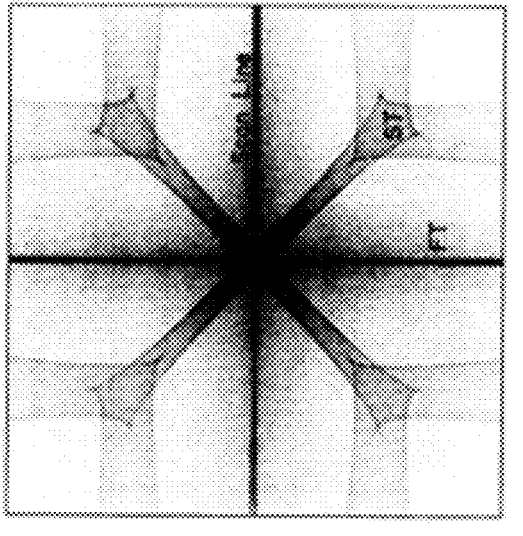
FIG. 3A is a graphical depiction of the focusing pattern of ultrasound along the crystal planes in [100] oriented crystalline silicon.

For the case in which the transformer array transducers are fabricated on an anisotropic substrate, such as silicon, the array transducers can be placed in specific locations to achieve maximum signals. It is known that in anisotropic substrates, a focusing effect can be observed for ultrasonic waves as they propagate more preferentially on certain crystal planes. FIG. 3A depicts the focusing pattern of ultrasound along the crystal planes in [100] oriented crystalline silicon as represented by the dark regions are where the ultrasound is focused. In FIG. 3A. ST and FT refers to slow transverse and fast transverse waves, respectively. Therefore, to achieve maximum received signals, the receive transformer array transducers 200 should can be located at those regions, as shown in FIG. 3B. Thus, FIG. 3B shows the optimal placement of transducers to maximize receive signal by placing the transducers in the areas where energy is concentrated due to focusing due to anisotropic wave propagation.

Figure 3D:
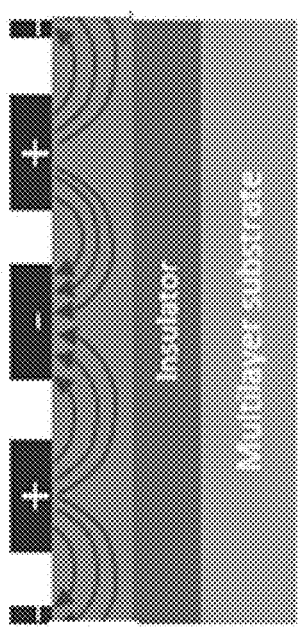
FIG. 3D is a cross-sectional side view schematic representation of the electric field between the fingers generating stress in the piezoelectric film.
Figure 3C:
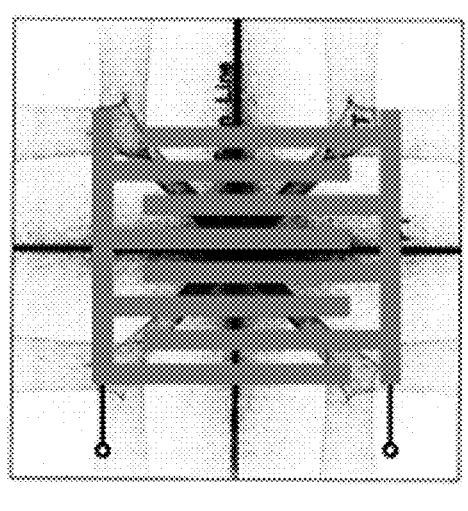
FIG. 3C is a graphical depiction and schematic representation of bulk transverse waves generated and received using interdigitated transducers.
Figure 3C:
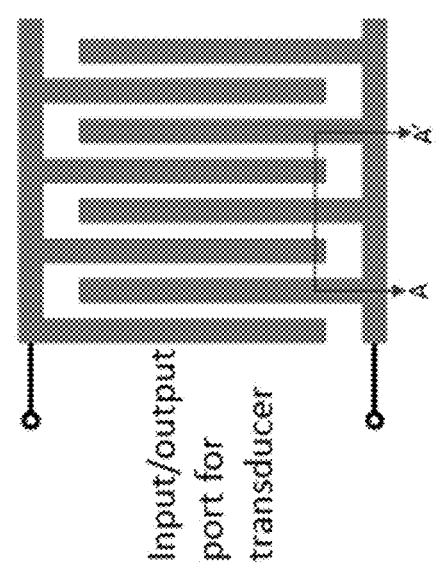

Each rectangle in the figure corresponds to a transducer 200 comprised of one unit transducer or a combination of unit transducers cascaded in series or parallel. These transducers 200 are then connected in series to increase the transducer output voltage. The different ways of connecting these unit transducers 200 in series is shown in the FIG. 3B. For example, these receive transducers 200 can be placed on the same side of the substrate as the transmit portion of the transformer or placed on the opposite side of the substrate. Also in the embodiment of FIG. 3B, the transducers 200 are transverse mode BAW transducers in receive mode. Bulk transverse waves can be generated and received using interdigitated transducers, as shown in FIG. 3C. In FIG. 3D, the electric field between the fingers generates stress in the piezoelectric film. By placing a set of electrodes on the transmit sides that are all connected together in transmit mode, but then segmenting the electrodes such that the electrodes with the highest intensity are electrically disconnected with the non-focused area. The received wave will generate a high voltage owing to the higher intensity.

Figure 4:
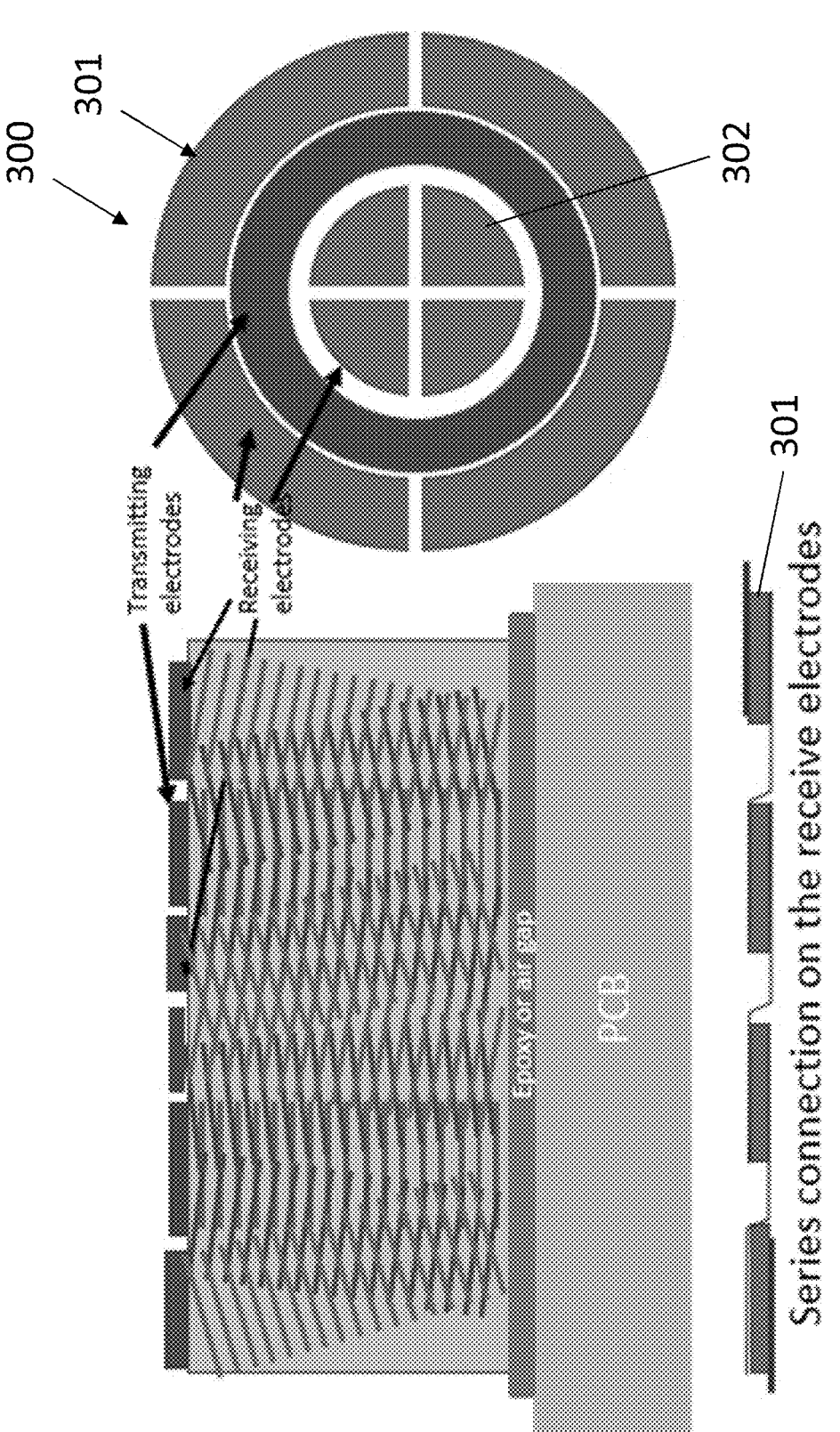
FIG. 4 is a schematic representation of a transducer with a HBAR resonator formed in the center, according to an embodiment.
Figure 5:
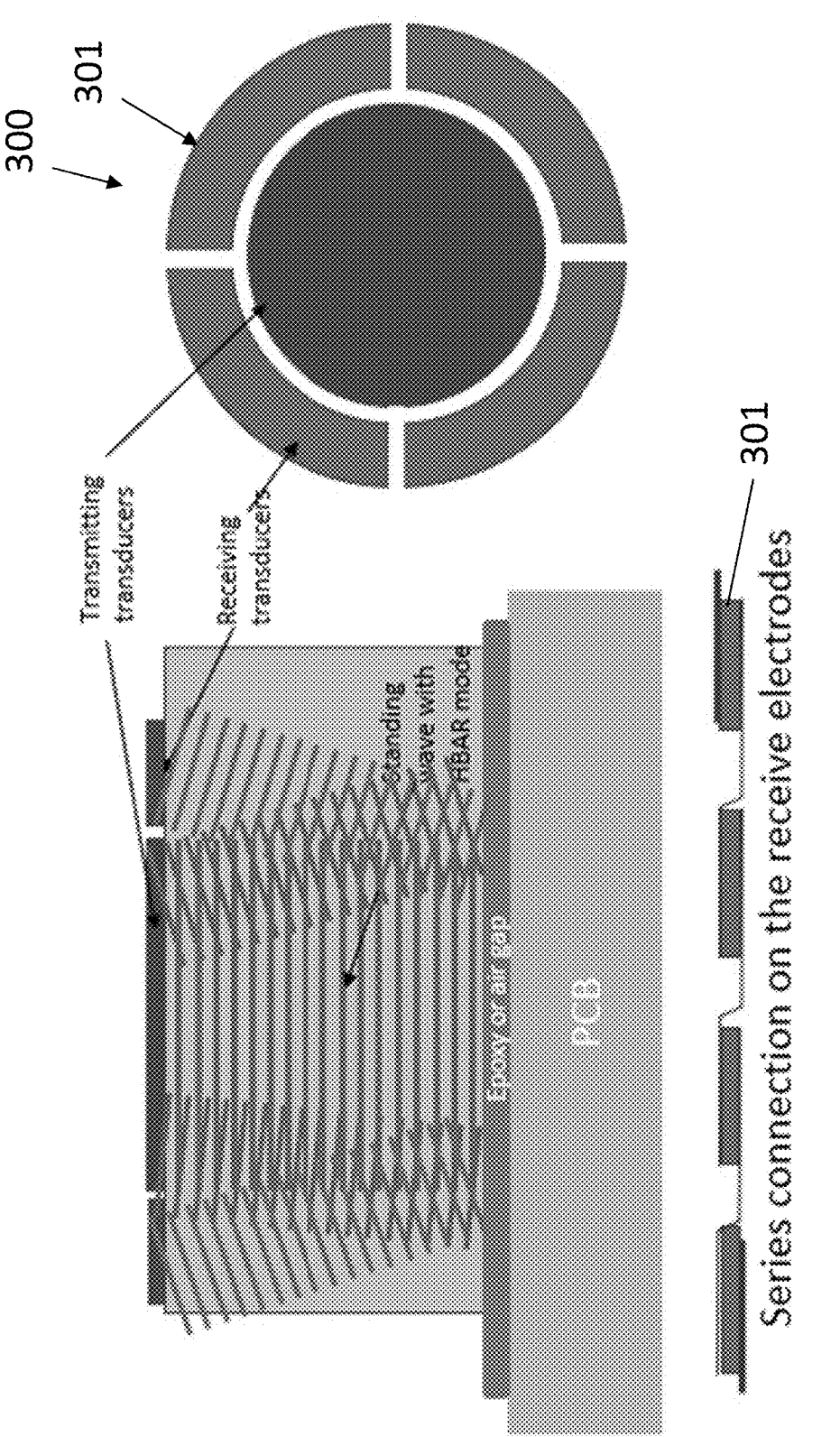
FIG. 5 is a schematic representation of a transducer with a HBAR resonator formed in the center, according to an alternative embodiment.

In FIGS. 4 and 5, there is shown an alternative method to increase voltage levels received on the receive ultrasonic transducers. The transducers comprise a transmitter 300 having an outer ring transducer 301, and the receiver transducers 302 are at the center of the circle (created by the shape of the outer ring transducer 301). The inner, receiver transducers 302 are connected in series. The transmitted pulse from the outer transducer 301 undergoes diffraction, and a significant fraction of the energy is received by the inner, receiver transducers 302. The diffracted waves on the outside can be lost or a secondary transducer can be used to pick up the diffracted energy. The inner, receiver transducers 302, where much of the energy is collected, can be connected in series to increase the voltage higher than if the area was only occupied by one large transducer.

In FIGS. 4 and 5, the energy is focused through diffraction and HBAR operation. FIG. 4 shows a HBAR resonator formed in the center. The diffracted waves are received at the receive electrodes 301, 302. The quality factor would boost voltages and the series connection will also increase voltage. In FIG. 5, a HBAR resonator is also formed in the center. The diffracted waves are received at the receive electrodes 301, 302 and the quality factor of the resonator and the series connection of receive transducers would serve to boost receive voltages.

Figure 6:
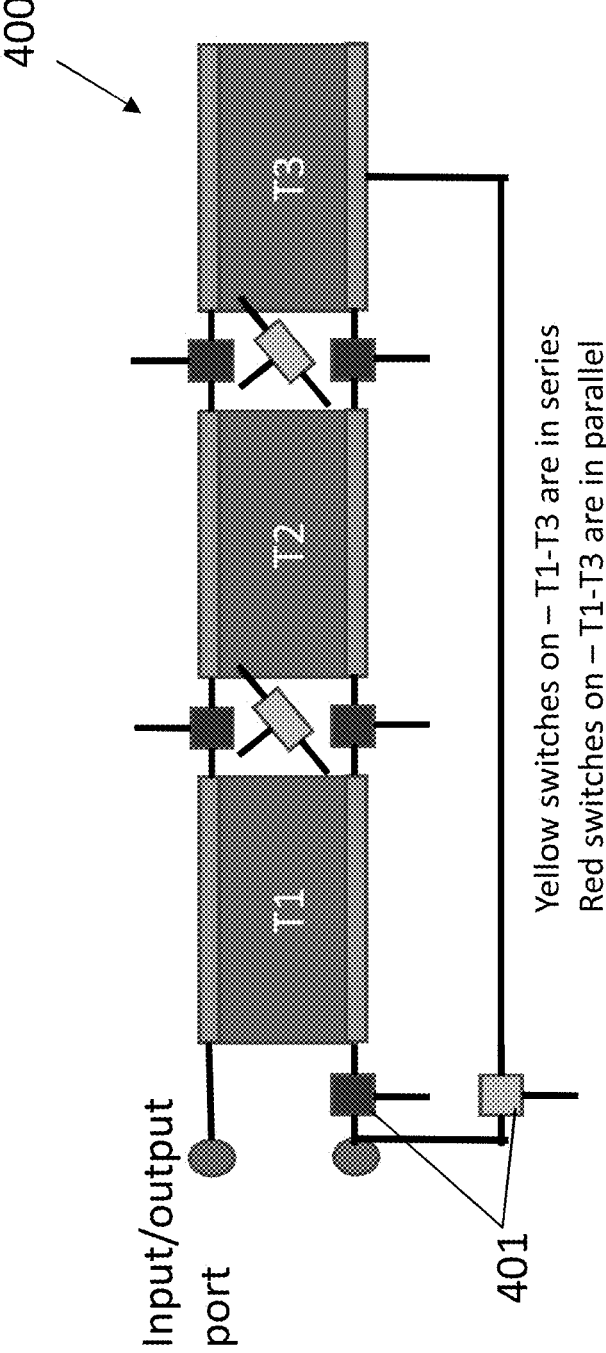
FIG. 6 is a schematic representation of transducers in a transmitter transducer array all connected in parallel and in series.
Figure 7A:
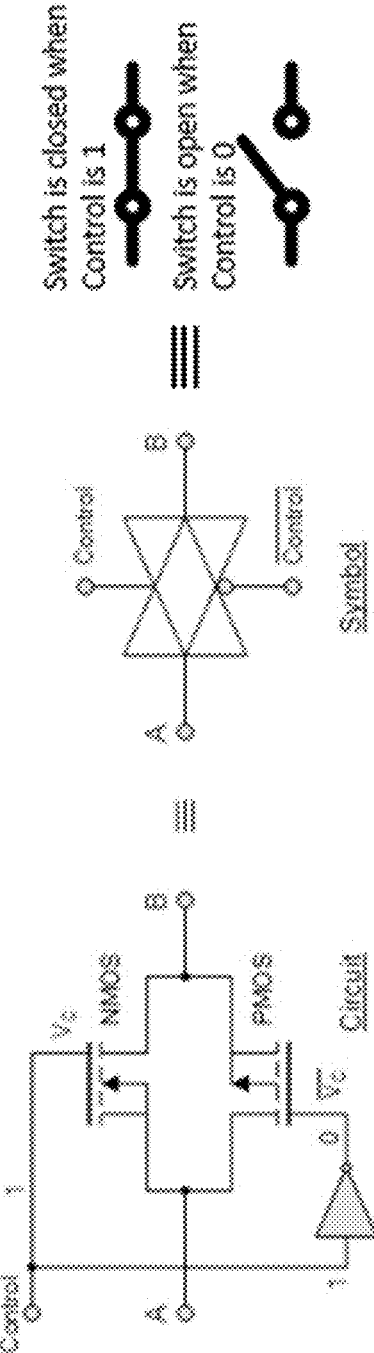
FIG. 7A is a schematic representation of the circuit of the transmitter transducer array of FIG. 6.
Figure 7B:
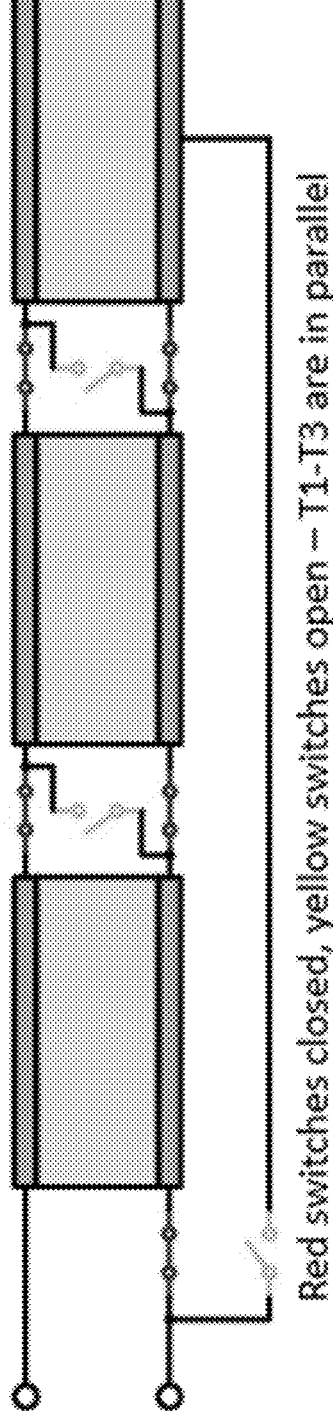
FIG. 7B is a schematic representation of transducers and transistor switches in a transmitter transducer array in parallel.
Figure 7C:
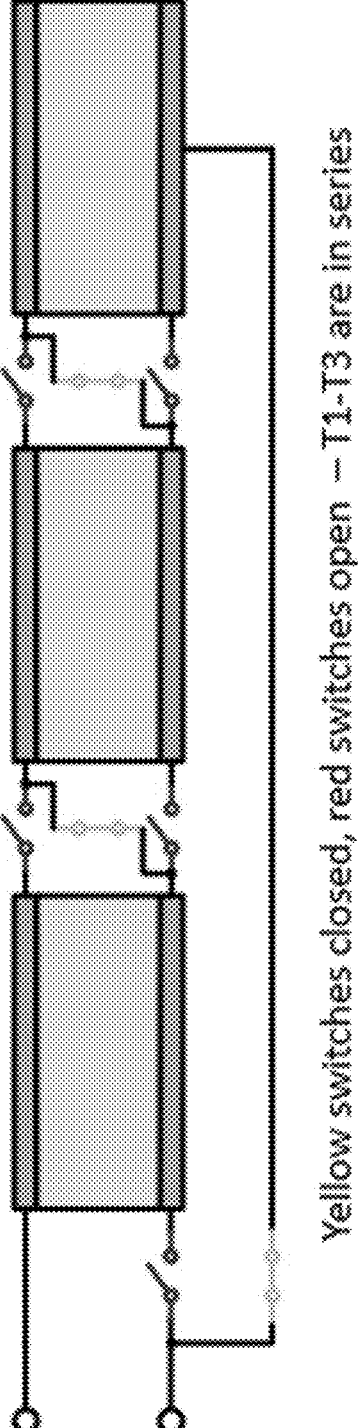
FIG. 7C is a schematic representation of transducers and transistor switches in a transmitter transducer array in series.

In another approach to increase the voltage generated from the piezoelectric transducers, shown in FIG. 6, to continue to amplify signals, the transducers T1, T2, T3 in a transmitter transducer array 400 are all connected in parallel in transmit mode generating an ultrasonic uniform pulse packet or continuous wave signal into the substrate. However, during the pulse transit time, at some time after the drive, when the energy in the substrate builds up due to continuous wave operation, or when the pulse returns back, the transducers T1, T2, T3 are connected in series such that the voltages are placed in series. This approach requires a set of transistor switches 401, such as those implemented by CMOS transistors, to toggle between two different types of connections (in parallel and in series). If the transistors are, intimately integrated in close proximity to the transducers T1, T2, 13, the parasitic capacitances of the wiring, the electrical pads to the chip can be reduced. FIGS. 7A-7C depict the circuit when the transducers T1, T2, T3 are in parallel and when the transducers T1, T2, T3 are in series.

Figure 8B:
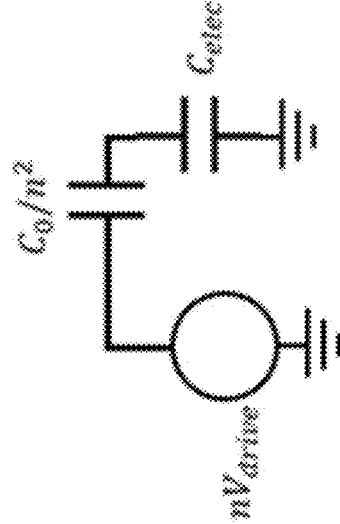
FIG. 8B is a schematic representation of a capacitive voltage divider with the capacitances of the receive transducer array of FIG. 8A.
Figure 8A:
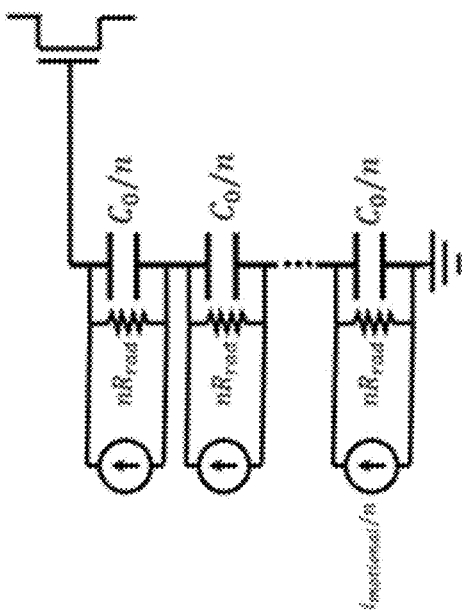
FIG. 8A is a schematic representation of a receive transducer transformer array with each transducer connected in series, connected to a transistor load.

Referring now to FIG. 8A, there is shown the receive transducer transformer array, with each transducer connected in series as in FIGS. 6-7C, connected to a transistor load, which represents the input stage for a transistor amplifier circuit. This transistor load can be modeled as a load capacitance $C_{elec}$. This transistor load would form a capacitive voltage divider with the capacitances of the receive transducer array, which add up in series for a series capacitance that can be approximated as $$\frac{c_0}{n^2},$$

where $C_0$, is the total capacitance or the transducers when driven in parallel, as shown in FIG. 8B. Therefore, the received voltage on the amplifier input is determined by the equation shown in FIG. 8C, where the effect of the radiation resistance is neglected due to the clamped capacitance dominating the impedance of the transducer.

Typical gate capacitance values for CMOS transistors can range from single femtofarads to tens of femtofarads in commonly available technology nodes such as the 65 nm, 130 nm, or 180 nm gate length technologies. The following example illustrates that the voltage present at the amplifier gate input is greater with the use of the series connected acoustic transformer array, as opposed to with a single transducer of the same area.

A 200 μm by 200 μm square transducer comprised of a 2 μm thick piezoelectric AlN film is approximately 1.6 pF in capacitance. In the case of the acoustic transformer, if this larger transducer were divided into an array of 7 transducers, the combined series capacitance would be approximately 0.0325 pF. Assuming a sum of the gate and source-drain, and junction capacitance of 10 fF, the voltage at the transistor gate is approximately 5.39 times higher using the series connected transducer array transformer as opposed to using a single transducer. This simple analysis is meant to illustrate the functionality of the device described herein. There may be additional variables such as the series resistance of the switching transistors that would limit the current output of the transducer, and present higher parasitic capacitance in parallel to the transistors. A transmission gate configuration of switch in CMOS has an effective on-state resistance is inversely proportional to the size of the transistors W/L where W is the width of the transistor and L is the length of the transistor. Hence, an optimized device will trade off the size of the switch transistors in order to reduce on-state resistance and the parasitic capacitances.

Figure 9C:
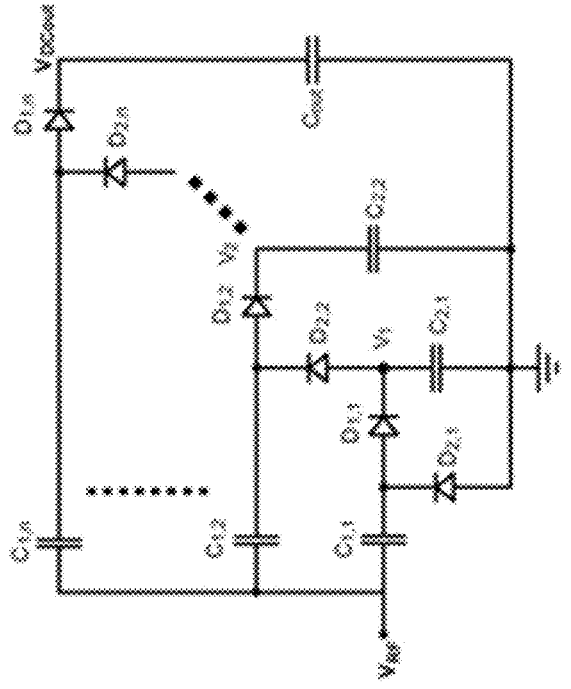
FIG. 9C is a schematic representation of a multi-stage rectifier circuit formed from integrated circuit capacitors and diodes.
Figure 9B:
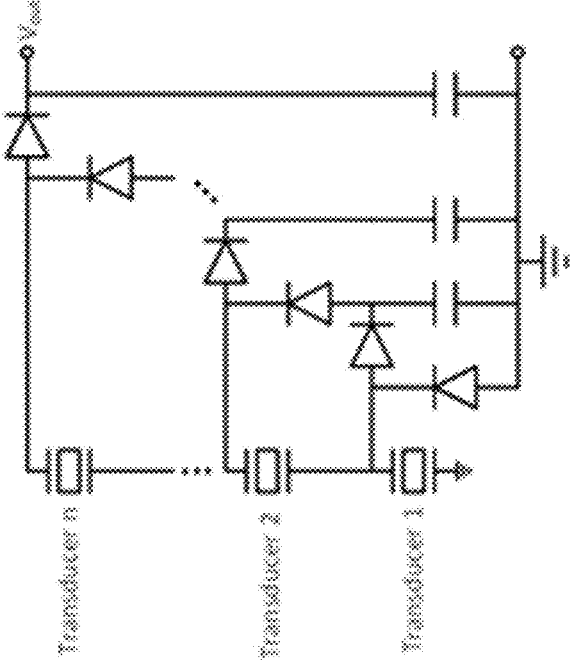
FIG. 9B is a schematic representation of acoustic transformer receive transducers connected by increasing the received voltage from a diode rectifier.

Another method of connecting the acoustic transformer array transducers to increase the received voltage from a diode rectifier is shown in FIG. 9B. The transducers are connected in series, similar to 9A, but in a cascaded arrangement (with cascaded diodes). In FIG. 9B, the positive terminal of each transducer is also connected to a diode rectifier. This concept is similar to the use of integrated circuit capacitors and diodes to form a multi-stage rectifier circuit, as shown in FIG. 9C, but by replacing the RF input coupling capacitors with the series connected transducers.

Figure 10:
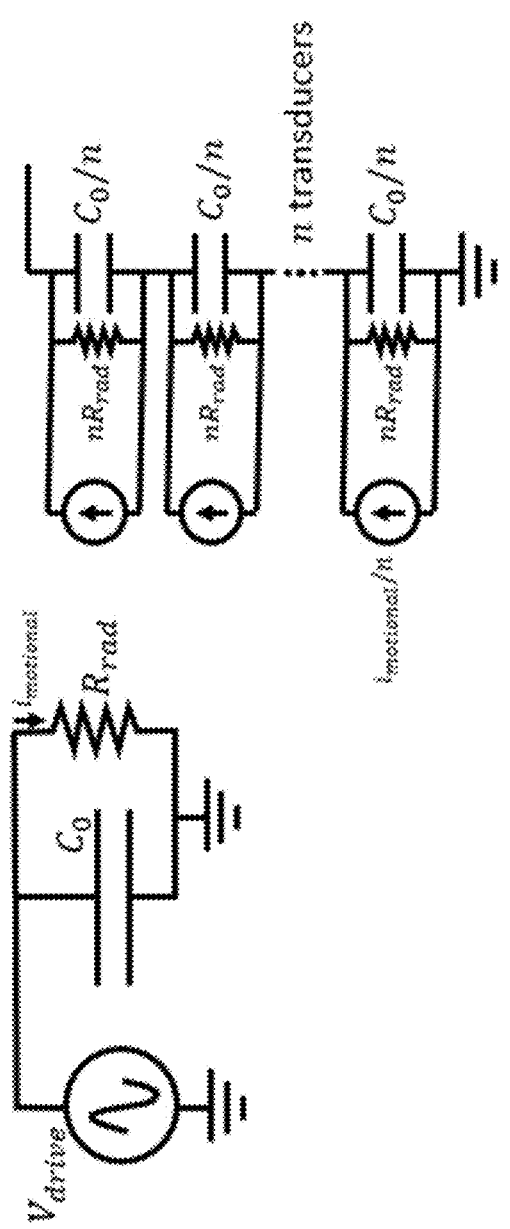
FIG. 10 is a schematic representation of a drive transducer.

Referring now to FIG. 10, there is shown a drive transducer. The larger transducer with an equivalent capacitance $C_0$ and an equivalent radiation resistance at resonance $R_{rad}$ are shown. When driven off resonance, two additional components, the equivalent mechanical inductance and capacitance, are in series with the radiation resistance. The larger transducer generates a mechanical wave train pulse that travels through the silicon bulk and comes back to the receive transducers. The pulse, when it gets back to the series receive transducer, is distributed, ideally equally, across the n smaller transducers. However, due to diffraction, and material losses, less than ideal energy will be received. In the ideal case, this leads to each transducer with an equivalent capacitance $$\frac{c_0}{n}$$

and motional resistance $nR_{rad}$. The capacitance of the n smaller capacitances each of $$\frac{c_0}{n}.$$

In series, the net capacitance is $$\frac{c_0}{n^2}.$$

The typical transistor amplifier input impedance consists of the gate capacitance and source drain parasitic capacitances. This capacitance can range from a single to tens of femto-farads.

While embodiments of the present invention has been particularly shown and described with reference to certain exemplary embodiments, it will be understood by one skilled in the art that various changes in detail may be effected therein without departing from the spirit and scope of the invention as defined by claims that can be supported by the written description and drawings. Further, where exemplary embodiments are described with reference to a certain number of elements it will be understood that the exemplary embodiments can be practiced utilizing either less than or more than the certain number of elements.

What is claimed is:

1. A transceiver apparatus for maximizing voltage, comprising:
   a substrate having a first surface and an opposing second surface;
   a CMOS device comprising one or more CMOS circuits attached to the first surface of the substrate;
   a plurality of piezoelectric transducers attached to an outer surface of the CMOS device; and
   wherein at least one of the plurality of piezoelectric transducers is configured to emit an ultrasonic wave toward the second surface of the substrate, and
   wherein at least two of the plurality of piezoelectric transducers are connected in series in a cascaded configuration and positioned to operate as receive transducers at a focal point of a diffraction pattern of the ultrasonic wave in the substrate.

2. The apparatus of claim 1, wherein the ultrasonic wave is phased.

3. The apparatus of claim 1, wherein the substrate is composed of a flexible, stretchable material.

4. The apparatus of claim 1, wherein the substrate is composed of at least one of a silicon wafer, a SiC wafer, and a silica wafer.

5. The apparatus of claim 1, wherein the plurality of piezoelectric transducers are composed of AlN or AlxScyN.

6. The apparatus of claim 1, wherein the ultrasonic wave is a standing ultrasonic wave.

7. A transceiver apparatus for maximizing voltage, comprising:
   a substrate having a first surface and an opposing second surface;
   a first layer of a plurality of piezoelectric transducers attached to the first surface of the substrate;
   a buffer layer attached to the first layer of the plurality of piezoelectric transducers;
   a second layer of one or more piezoelectric transducers attached to the buffer layer such that the buffer layer is between the first and second layers of the plurality of piezoelectric transducers; and wherein at least one of the first layer of the plurality of piezoelectric transducers and the second layer of the plurality of piezoelectric transducers are connected in series in a cascaded configuration via electrical connectors,
   wherein the other of the first layer of the plurality of piezoelectric transducers and the second layer of the plurality of piezoelectric transducers are confirmed to emit an ultrasonic wave toward the substrate, and
   wherein the at least one of the first layer of the plurality of piezoelectric transducers and the second layer of the plurality of piezoelectric transducers that is connected in series in the cascaded configuration is positioned at a focal point of a diffraction pattern of the ultrasonic wave in the substrate.

8. The apparatus of claim 7, further comprising a top insulative layer attached to an outer surface of the second layer of the plurality of piezoelectric layers.

9. The apparatus of claim 7, further comprising a CMOS device comprising one or more CMOS circuits, the CMOS device connected between the first layer of the plurality of piezoelectric transducers and the substrate.

10. The apparatus of claim 9, wherein the CMOS device comprises a BEOL layer and a FEOL layer, wherein the BEOL layer is a metallization layer and the FEOL layer is a transistor layer connected between the BEOL layer and the substrate.

11. The apparatus of claim 9, further comprising an insulative layer connected between the first layer of the plurality of piezoelectric transducers and the CMOS device.

12. The apparatus of claim 9, further comprising metal vias connecting the electrical connectors to the CMOS device.

13. The apparatus of claim 7, further comprising electrical pads connected to the electrical connectors and extending at least to an outer surface of the first or second layer of the plurality of piezoelectric transducers.

14. The apparatus of claim 7, wherein the substrate has a backside with a pattern.

15. The apparatus of claim 7, wherein the second layer of the plurality of piezoelectric transducers comprises at least one space between two of the plurality of piezoelectric transducers.

16. The apparatus of claim 7, wherein at least one of the first layer of the plurality of piezoelectric transducers and the second layer of the plurality of piezoelectric transducers is one large transducer.

17. The apparatus of claim 7, wherein in at least one of the first layer of the plurality of piezoelectric transducers and the second layer of the plurality of piezoelectric transducers, the piezoelectric transducers are connected in parallel.

18. A transceiver apparatus for maximizing voltage, comprising:
   a substrate having a first surface and an opposing second surface;
   a plurality of piezoelectric transducers attached to the first surface of the substrate;
   wherein each of at least one of the one or more plurality of piezoelectric transducers is configured to emit an ultrasonic wave toward the second surface of the substrate; and
   wherein the plurality of piezoelectric transducers are connected in a circuit with one or more transistor switches that can be turned on or off to achieve reconfigurability between a first configuration and a second configuration, wherein in at least one of the first configuration and the second configuration the plurality of piezoelectric transducers are connected in series by the one or more transistor switches, and wherein at least some of the plurality of piezoelectric transducers are positioned to operate as receive transducers at a focal point of a diffraction pattern of the ultrasonic waves in the substrate.

19. The apparatus of claim 18, wherein in the first configuration, the plurality of piezoelectric transducers are connected by the one or more transistor switches to transmit in parallel and in the second configuration, the plurality of piezoelectric transducers are connected by the one or more transistor switches to receive in series.

* * * * *